United States Patent [19]

Uchida et al.

[11] Patent Number: 5,068,871
[45] Date of Patent: Nov. 26, 1991

[54] PROCESS FOR SYNTHESIZING DIAMOND AND APPARATUS THEREFOR

[75] Inventors: Kiyoshi Uchida, Toyota; Shoji Noda, Aichi; Kazuo Higuchi, Seto, all of Japan

[73] Assignees: Kabushiki Kaisha Toyota Chuo Kenkyusho; Toyota Jidosha Kabushiki Kaisha, both of Toyota, Japan

[21] Appl. No.: 563,187

[22] Filed: Aug. 6, 1990

[30] Foreign Application Priority Data

Aug. 4, 1989 [JP] Japan .................. 1-203582

[51] Int. Cl.5 .......................... H01J 37/305
[52] U.S. Cl. ........................ 373/17; 373/63; 423/446; 427/38; 427/39; 156/DIG. 68
[58] Field of Search .............. 427/37, 38, 39, 122, 427/294, 113, 318, 314; 423/446; 204/173; 373/88, 60, 18, 13, 24, 17, 63, 120; 156/DIG. 68; 431/328

[56] References Cited

U.S. PATENT DOCUMENTS

| | | | |
|---|---|---|---|
| 3,749,760 | 7/1973 | Deryagin et al. | 423/446 |
| 4,481,180 | 11/1984 | Bedére et al. | 423/446 |
| 4,533,318 | 8/1985 | Buehl | 431/328 |
| 4,632,817 | 12/1986 | Yazu et al. | 423/446 |
| 4,767,608 | 8/1988 | Matsumoto et al. | 423/446 |
| 4,816,286 | 3/1989 | Hirose | 427/39 |
| 4,859,490 | 8/1989 | Ikegaya et al. | 427/294 |
| 4,900,628 | 2/1990 | Ikegaya et al. | 428/408 |
| 4,915,977 | 4/1990 | Okamoto et al. | 427/37 |
| 4,938,940 | 7/1990 | Hirose et al. | 423/446 |

FOREIGN PATENT DOCUMENTS

| | | |
|---|---|---|
| 58-91100 | 5/1983 | Japan . |
| 60/118694 | 6/1985 | Japan . |
| 60/191097 | 9/1985 | Japan . |
| 62/113796 | 5/1987 | Japan . |
| 264997 | 10/1989 | Japan . |
| 2214768 | 9/1989 | United Kingdom ......... 373/120 |

OTHER PUBLICATIONS

"Synthesizing Diamond in Flames in Atmosphere", pp. 198-200.
"New Diamond", vol. 4, No. 3, pp. 34-35.
Materials Letters, vol. 7, 8, "Diamond Synthesis Using an Oxygen-Acetylene Torch", pp. 289-292.

Primary Examiner—Bruce A. Reynolds
Assistant Examiner—Tu Hoang
Attorney, Agent, or Firm—Finnegan, Henderson, Farabow, Garrett & Dunner

[57] ABSTRACT

A process for synthesizing diamond includes bringing a reactant gas is brought into contact with a porous heating element to form an activated gas, and bringing the activated gas into contact with a substrate to deposit diamond thereon. An apparatus for synthesizing diamond includes a heating means member including a porous heating element, a substrate, and a diamond depositing member. The reactant gas is heated and activated uniformly to a high temperature appropriate for synthesizing diamond by bringing the reactant gas into contact with the porous heating element, whereby a high quality polycrystalline diamond film can be deposited over a wider area on the surface of the substrate.

11 Claims, 3 Drawing Sheets

PROCESS FOR SYNTHESIZING DIAMOND AND APPARATUS THEREFOR

BACKGROUND OF THE INVENTION

1. Field of the Invention

The present invention relates to a process for synthesizing diamond in a film shape or a particle shape on a substrate by a vapor phase method, and an apparatus for synthesizing for same.

2. Description of the Related Art

In a diamond synthesis by a vapor phase method, a reactant gas including at least a carbonaceous source gas such as methane and the like is turned into an activated gas with plasma or the like. The activated gas is brought into contact with a surface of a substrate whose temperature is controlled at a temperature appropriate for diamond deposition, thereby depositing diamond thereon. In the diamond synthesis, non-diamond phase such as graphite and the like is generated as a by-product. Active species such as atomic hydrogen, oxygen or the like is accordingly brought into contact with the surface of the substrate simultaneously with the activated gas, thereby removing the non-diamond phase by utilizing the difference between the chemical reaction rates of the diamond and the non-diamond phase with respect to the active species.

A variety of diamond synthesis methods, for instance, a hot filament assisted chemical vapor deposition method, a microwave plasma assisted chemical vapor deposition method, an electron plasma assisted chemical vapor deposition method, a direct current electrical discharge plasma assisted chemical vapor deposition method, a radio frequency wave plasma assisted chemical vapor deposition method, a direct current arc electrical discharge plasma assisted chemical vapor deposition method, a combustion flame method and the like, have been proposed, each producing the activated gas with different means. Among them, the hot filament assisted chemical vapor deposition method and the combustion flame method are advantageous because they do not require large-scale equipment.

The above-mentioned hot filament assisted chemical vapor deposition method is an easy and convenient method. By applying the principle of the method, it is possible to enlarge a depositing area of film-shaped diamond and to increase a depositing rate thereof. In the hot filament assisted chemical vapor deposition method, an electric current flows along in a tungsten wire employed as a filament, thereby heating the tungsten wire to 2000° C. or more. A reactant gas is then brought into contact with the tungsten wire, thereby producing an activated gas. However, the tungsten wire is carbonized during the course of the method, and the filament coil is deformed accordingly. As a result, the temperature distribution and the concentration distribution of the activated gas vary, and diamond deposits unevenly on a surface of a substrate. In addition, the exothermic temperature of the tungsten wire varies due to the electric resistance value change resulting from the carbonization of the tungsten wire. There has been proposed a method in which tantalum carbide is employed as the filament, however, it is hard to fulfill an enlargement of a diamond film depositing area by the proposed method.

SUMMARY OF THE INVENTION

It is therefore an object of the present invention to provide a process and an apparatus for enabling to synthesize diamond in a film shape or a particle shape in an enlarged depositing area at a high depositing rate. The above and other objects are carried out by a process and an apparatus for synthesizing diamond according to the present invention.

The process for synthesizing diamond according to the present invention comprises: an activated gas forming step of bringing a reactant gas comprising at least a carbonaceous source gas into contact with a porous heating element and raising a temperature up to 2000° C. or more, said porous heating element being heated at a high temperature by electric resistance heating by applying electricity thereto, having a melting point or a decomposition temperature of 2000° C. or more and low vapor pressure and comprising at least one of metal and electrically conductive ceramics, thereby forming an activated gas; and a diamond depositing step of bringing the activated gas obtained into contact with a surface of a substrate, thereby depositing diamond on the substrate.

The apparatus for synthesizing diamond according to the present invention is adapted for the above-mentioned process and comprises: a heating means comprising a porous heating element having a melting point or a decomposition temperature of 2000° C. or more and low vapor pressure and comprising at least one of metal and electrically conductive ceramics, at least a pair of electrodes for applying electricity to the porous heating element, an inlet port for introducing a reactant gas comprising at least a carbonaceous source gas into the porous heating element and an outlet port for delivering out an activated gas generated by heating the reactant gas with the porous heating element; a substrate disposed on the outlet port side of the heating means; and a diamond depositing means for controlling a temperature of the substrate.

The process for synthesizing diamond according to the present invention comprises the activated gas forming step of bringing the reactant gas into contact with the porous heating element thereby forming the activated gas and the diamond depositing step of bringing the activated gas into contact with the surface of the substrate thereby depositing diamond as aforementioned.

As for the reactant gas employed in the activated gas forming step, one or more of carbonaceous source gases may be employed, or the carbonaceous source gases may be mixed and employed with a gas constituting a hydrogenous source such as hydrogen or the like. As for the carbonaceous source gas, the following gases which have been known conventionally may be employed: carbon monoxide, carbon dioxide, gasified saturated hydrocarbons, gasified unsaturated hydrocarbons, and gasified organic compounds such as alcohols, ethers, ketones, aldehydes, amines, amides and the like.

As for the porous heating element, it may be formed of at least one of metal and electrically conductive ceramics having a melting temperature or a decomposition temperature of 2000° C. or more. In particular, the following porous bodies may be employed as the porous heating element: for instance, a foamed porous body in which the pores are formed continuously, and a porous body whose continuous pores are formed among packed particles.

When forming the porous heating element with the packed particles, the contact points among the packed particles are electrically high resistant portions, and the electrically high resistant portions are dispersed over the entire porous heating element uniformly, whereby it is more likely to obtain an advantage of a uniform heating. When the average particle size of the packed particles is too small, the formed pores become smaller, thereby giving a larger resistance to the flow of the reactant gas. Accordingly, the average particle size thereof is preferred to be 1 mm or more in diameter. On the other hand, when the average particle diameter of the packed particles is too large, the contact points among them become less in number, whereby the temperature distribution of the porous heating element becomes uniform as a whole. Accordingly, the average particle size thereof is preferred to be 5 mm or less in diameter. In addition, it is preferred to mix packed particles of larger average particle sizes with packed particles of smaller average particle sizes and form a porous heating element.

As for the metal or electrically conductive ceramic having a melting point or a decomposition temperature of 2000° C. or more and low vapor pressure, the following may be employed: metal of a high melting point such as tungsten, tantalum and the like, and electrically conductive ceramics of a high melting point such as tungsten carbide, tantalum carbide, zirconium boride and the like.

In the process for synthesizing diamond according to the present invention, an electric current is flowed in the porous heating element, and the heat is generated by the electric resistance thereof, whereby the porous heating element itself is heated up to a temperature of 2000° C. or more. The reactant gas is introduced into the pores of the porous heating element to be heated to a temperature of 2000° C. or more, thereby generating activated species of carbon and atomic hydrogens.

In the diamond depositing step, the activated species of carbon and atomic hydrogen obtained through the activated gas forming step are brought into contact with the surface of the substrate whose temperature is controlled, thereby depositing diamond on the surface of the substrate.

As for the substrate, the following material on which the diamond easily deposits may be used: sintered tungsten carbide, silicon, silicon carbide, alumina, tungsten, molybdenum and the like. Since the diamond grows into a film by the mechanism of nucleation and grain growth, it is preferable to abrade and roughen the surface of the substrate in advance, for instance, with a diamond powder, thereby increasing the number of the diamond nucleation points on the surface of the substrate. However, the abrading and roughening operations are not required when the concentration of the activated species of carbon is high and the film depositing rate is rapid.

Further, it is preferable to control the temperature of the substrate to approximately 500° to 1100° C. in order to deposit diamond on the substrate. The means for controlling the temperature of the substrate is not specified particularly. For instance, the following well known arrangement may be employed: The substrate may be cooled from the rear surface thereof at all times with water whose flow rate is properly adjusted.

Furthermore, the activated gas forming step and the diamond depositing step may be carried out under a depressurized condition or a pressurized condition. When the pressure controls are applied to the reaction, a vacuum chamber or a pressurized chamber come to be required.

In addition, it is preferable to dispose a metal net and the like for straightening the gas flow between the porous heating element and the substrate. The metal net may be used not only for a gas flow straightener but also for a grid electrode. Namely, a high DC electric voltage may be applied between the metal net and the substrate thereby depositing diamond by the electron assisted chemical vapor deposition method.

The apparatus for synthesizing diamond according to the present invention comprises the heating means with the above-mentioned porous heating element incorporated therein, the temperature measuring means and the diamond depositing means.

The heating means is a chamber for producing the above-mentioned activated gas. The heating means comprises the porous heating element, a pair of electrodes for applying electricity to the porous heating element, an inlet port for introducing the reactant gas into the porous heating element and an outlet port for delivering out the activated gas generated. The pair of electrodes are disposed on the both sides of the porous heating element. The temperature measuring means such as a pyrometer serves to measure the temperature of the porous heating element on the outlet port side thereof. It is preferable to provide a temperature control means for controlling the electric current flow in accordance with the temperature measured by the temperature measuring means.

The diamond depositing means is for holding the substrate whose surface is to be covered with diamond, and controlling the temperature of the substrate. The diamond depositing means is disposed on the outlet port side for discharging out the activated gas.

Moreover, the whole of the apparatus for synthesizing diamond may be accommodated in a pressurized chamber or a depressurized chamber.

Thus, according to the above-mentioned process and apparatus, the carbonaceous source in the reactant gas is heated to a high temperature appropriate for the diamond growth by bringing the reactant gas into contact with the porous heating element, and deposits as high density diamond nuclei over a wider area on the surface of the substrate disposed on the side of the outlet port, and finally the nuclei grow into a favorable polycrystalline diamond film.

As having been described so far, since the electricity is applied to the porous heating element directly, the heating means for activating the reactant gas can be enlarged as large as possible depending on the purposes. Here, since the metal of a high melting point such as tungsten, tantalum or the like, and the electrically conductive ceramics of a high melting point such as tungsten carbide, tantalum carbide, zirconium boride or the like are employed for forming the porous heating element, it is possible to carry out the heating at a high temperature. As a result, since the activated species of carbon and hydrogen can be generated in high concentrations, a diamond film of a high quality can be deposited at a high depositing rate. In addition, when the porous heating element is composed of the packed particles, the whole porous heating element can be heated further uniformly, and the reactant gas can be activated uniformly to the same extent. Consequently, it is possible to synthesize a diamond film of a much higher quality.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS OF THE INVENTION

Having generally described the present invention, a further understanding can be obtained by reference to certain specific preferred embodiments which are provided herein for purposes of illustration only and are not intended to be limiting unless otherwise specified.

FIRST PREFERRED EMBODIMENT

Figure 1:
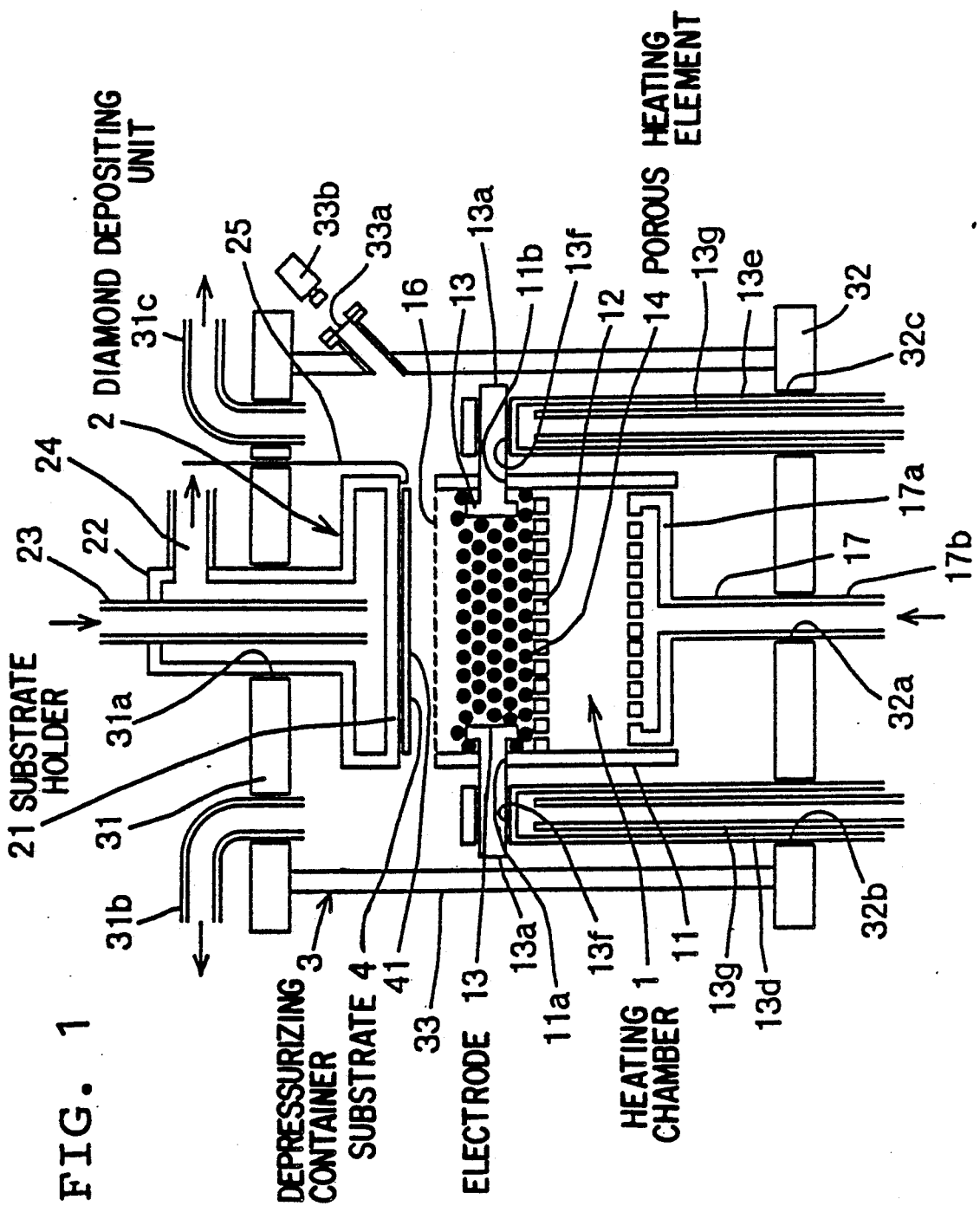
FIG. 1 is a vertical cross sectional view of an apparatus for synthesizing diamond described as a first preferred embodiment according to the present invention.

The present invention will be hereinafter described with reference to the first preferred embodiment according to the present invention. First of all, an apparatus for synthesizing diamond employed in the first preferred embodiment will be hereinafter described. As illustrated in FIG. 1, the apparatus comprises a heating chamber 1 for making a reactant gas into an activated gas and a diamond depositing unit 2 for depositing diamond thereon out of the activated gas, and is accommodated in a depressurized chamber 3.

The depressurized chamber 3 is made of stainless steel, and comprises an upper plate 31 formed in a disk shape, a lower plate 32 formed also in a disk shape and a cylindrical portion 33 formed in a cylinder shape. At the center of the upper plate 31, a center bore 31a is drilled through, and the diamond depositing unit 2 is fixed in the center bore 31a. Further, at the periphery portions of the upper plate 31, an exhaust pipe 31b connected to a vacuum pump (not shown) and a ventilation pipe 31c connected to a pressure gage (not shown) are fixed. The exhaust pipe 31b and the ventilation pipe 31c are opened at one ends thereof, and inserted into the depressurized chamber 3.

The lower plate 32 has a center bore 32a at the center thereof, and two through bores 32b and 32c at the periphery portions thereof. The cylindrical portion 33 is formed in a cylinder shape which is larger in diameter but relatively shorter in height. At the upper periphery wall of the cylinder portion 33, the cylinder portion 33 is provided with a viewing port 33a protruding upwards and obliquely. The upper plate 31 and the lower plate 32 are disposed at the both opening ends of the cylinder portion 33, thereby forming the depressurized chamber 3.

The heating chamber 1 is formed in a square cylinder 11. The square cylinder 11 is disposed at the center in the depressurized chamber 3, and made of boron carbide ($B_4C$) in a dimension of approximately 80 mm in each of the length, width and height. At the upper portions of the opposite walls of the square cylinder 11, there is formed a pair of through bores 11a and 11b facing each other. Further, the square cylinder 11 is provided with a bottom plate 12 at a portion immediately below the through bores 11a and 11b and below the top end thereof by approximately 15 mm. The bottom plate 12 is disposed in a manner traversing the cross section of the heating chamber 1, and formed of boron carbide in a mesh shape having a plurality of tiny through bores.

Figure 2:
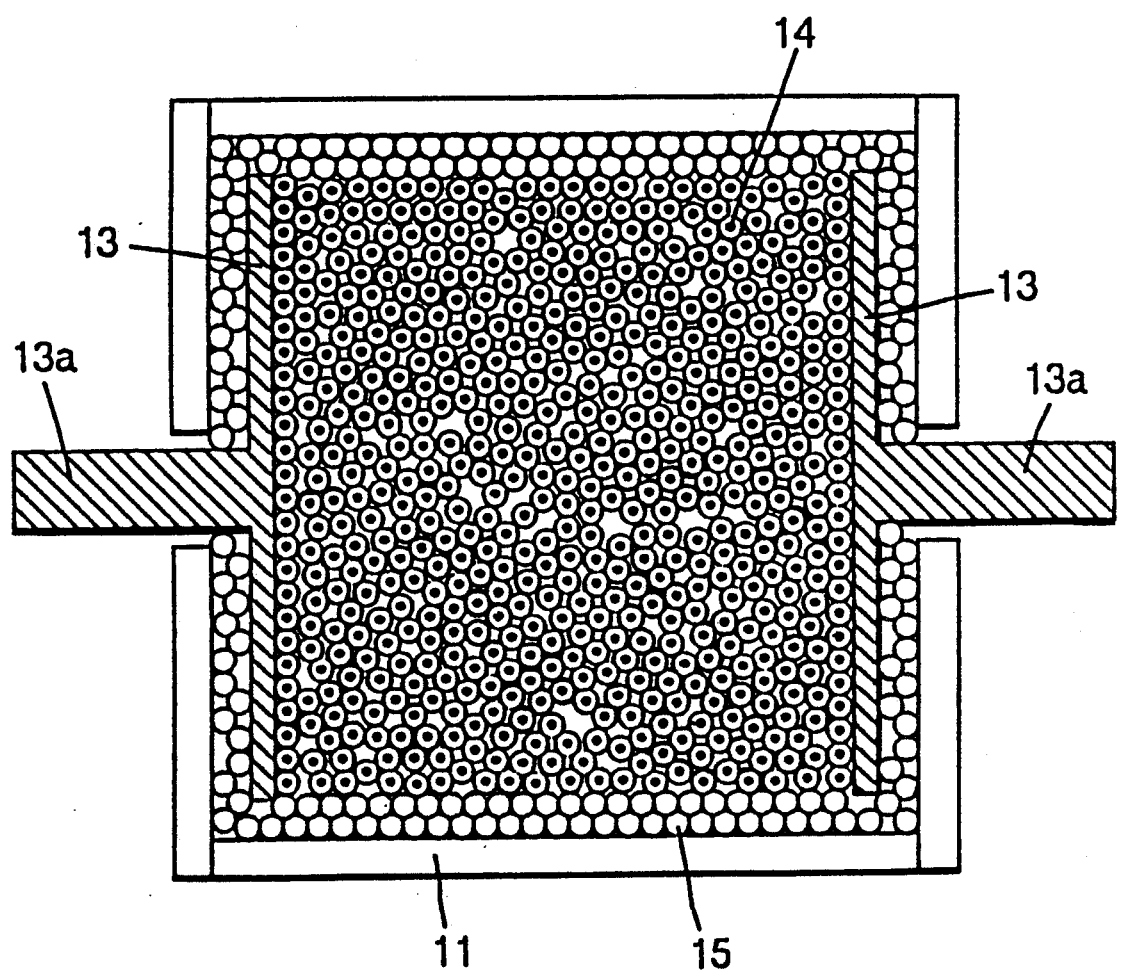
FIG. 2 is a horizontal cross sectional view of a major portion of a heating chamber of the apparatus for synthesizing diamond illustrated in FIG. 1.

In the space above the bottom plate 12, a pair of electrodes 13 and 13 made of tantalum are placed as illustrated in FIG. 2. The electrodes 13 and 13 have a protruding portion 13a on the rear side thereof, and the protruding portions 13a and 13a are inserted into the through bores 11a and 11b respectively so that they protrude into the outer circumference of the square cylinder 11. Further, the protrusions 13a and 13a of the electrodes 13 and 13 are held by columnar electrode terminals 13d and 13e which are respectively inserted into the through bores 32b and 32c disposed at the periphery portions of the lower plate 32. Here, the columnar electrode terminals 13d and 13e have a bearing bore 13f at the top portion thereof which holds and have the protruding portions 13a and 13a of the electrodes 13 and 13 inserted thereinto. Further, the columnar electrode terminals 13d and 13e have a cooling water conduit 13g for delivering a cooling water in themselves.

In the space above the bottom plate 12 as well as between the pair of the electrodes 13 and 13, a porous heating element 14 according to the present invention is disposed. The porous heating element 14 is formed by disposing and packing ceramics particles made of gravel-shaped tantalum carbide (TaC) in the average particle size range of approximately 1.2 to 2.0 mm in square cylinder 11 by a thickness of approximately 10 mm.

The ceramics particles are prepared in the following manner: The metal tantalum fragments are heated in advance at a temperature of 2500° C. for 10 hours in an argon gas flow including methane gas, thereby carbonizing the metal tantalum fragments into tantalum carbide fragments. The obtained tantalum carbide fragments are gently broken into pieces, and sieved in order to obtain gravel-shaped tantalum carbide particles falling in the average particle size of 1.5 to 2.0 mm only. The gravel-shaped tantalum carbide particles were again heated at a temperature of 2500 ° C. for 10 hours in an argon gas flow including methane gas, cooled and then washed with benzene.

Further, as illustrated in FIG. 2, boron carbide formed in coarse grain shapes having an average particle size of approximately 2 mm is filled between the porous heating element 14 and the inner surface of the square cylinder 11 by approximately 10 mm in thickness, thereby forming an insulator layer 15.

Furthermore, a metal net 16 made of metal tantalum is disposed at the top of the square cylinder 11 on the outlet port side, and a funnel-shaped diffuser 17 for introducing the reactant gas into the square cylinder 11 is disposed at the bottom of the square cylinder 11 on the inlet port side. The funnel-shaped diffuser 17 comprises a hollow head portion 17a having a plurality of through bores at the top end thereof and formed in a square shape, and an introducing pipe 17b protruding downwards from the bottom center of the hollow head portion 17a and formed in a pipe shape. The introducing pipe 17b is inserted into the center bore 32a of the lower plate 32 of the depressurized chamber 3, extended further downwards, and communicated with a bomb (not shown) for storing the reactant gas by way of a flow rate controller (not shown).

The diamond depositing unit 2 comprises a hollow substrate holder 21 extending horizontally and formed in a thick plate shape, a hollow base 22 extending integrally from the top center of the hollow substrate holder 21 and communicating with the hollow substrate holder 21, a cooling water supply pipe 23 inserted into and held by the hollow base 22, and a discharge port 24. The top portion of the base 22 is inserted into the center bore 31a of the upper plate 31 of the depressurized chamber 3 in a manner extending upwards, and is protruded further from the top portion of the upper plate 31. Thus, the top portion of the base 22, the cooling water supply pipe 23 and the discharge port 24 are placed outside the depressurized chamber 3.

A substrate 4 is fixed on the bottom surface of the substrate holder 21. Here, the substrate 4 is fixed thereon so that a diamond depositing surface 41 of the substrate 4 is placed opposite to the porous heating element 14 and that there is provided a clearance of 10 mm between the diamond depositing surface 41 and the porous heating element 14.

A process for synthesizing diamond according to the present invention was carried out with the diamond synthesis apparatus having the structure thus arranged.

As for the substrate 4, a silicon wafer of 3 inches in diameter was prepared. Further, the mirror-finished (100) planes of the silicon wafer were scratched in advance with a diamond abrasive grain in order to use them as the diamond depositing surface 41.

As for the reactant gas, 3 kinds of reactant gases set forth in Table 1 were prepared, and each of the reactant gases comprising 0.1, 0.5 and 2.0% by volume of methane gas respectively and the balance of hydrogen gas. The supply flow rate of the reactant gases was 1 liter/minute, and the supply flow rate value was one converted into a value at the temperature of 20° C. and 1 atm. As also set forth in Table 1, the porous heating element was heated to 3 levels, namely at the temperatures of 2800° C., 3000° C. and 3300° C.

The process for synthesizing diamond was carried out in the following procedure: First, the substrate 4 was fixed on the substrate holder 21, and then there was provided a clearance of 10 mm between the diamond depositing surface 41 of the fixed substrate 4 and the top surface of the porous heating element 14.

Next, the inside of the depressurized chamber 3 was depressurized to the vacuum of $10^{-3}$ Torr with the vacuum pump (not shown) in advance, and a voltage was applied to the porous heating element 14 with a 40 KW alternate current transformer having a voltage capacity of 200 V at maximum, thereby applying electricity to the porous heating element 14. At the beginning, a relatively low voltage was applied between the electrodes 13 and 13, and then the voltage was gradually increased to raise the temperature of the porous heating element 14 to the temperatures as set forth in Table 1. Here, the temperature of the porous heating element 14 was observed and measured with the pyrometer 33b by way of the observation window 33a, thereby controlling the voltage to be applied to the porous heating element 14.

Simultaneously with the application of the electricity to the porous heating element 14, the temperature of the substrate 4 was detected with the thermocouple 25 disposed adjacent to the substrate holder 21, thereby controlling the flow rate of the cooling water to be introduced into the cooling water supply pipe 23. Thus, the temperature of the substrate 4 was maintained at 800° C.

The introduction of the reactant gas into the heating chamber 1 was started when the temperature of the porous heating element 14 reached at approximately 800° C. Here, the reactant gases having the 3 predetermined compositions as set forth in Table 1 were introduced into the heating chamber 1 by way of the diffuser 17 respectively. In addition, the pressure in the depressurized chamber 3 was maintained at 20 Torr at all time with an automatic pressure adjusting valve (not shown) disposed between the depressurized chamber 3 and the vacuum pump (not shown), and the time for depositing diamond was set at 20 minutes under the conditions set forth in Table 1.

The process for synthesizing diamond according to the present invention was carried out in the above-mentioned manner under the 9 conditions set forth in Table 1. Film-shaped diamonds were deposited all over the diamond depositing surface 41 of the substrate 4 having 3 inches in diameter under all of the 9 synthesis conditions. The diamonds thus obtained hardly contained the non-diamond phase, and were of good qualities. The film-shaped diamonds thus obtained were analyzed and evaluated by the X-ray diffraction analysis and the Raman spectroscopy. As a result, the deposited film-shaped diamonds were found to be polycrystalline films. The results of the Raman spectroscopy are also set forth in Table 1.

TABLE 1

| Methane Amount (Vol. %) | Temperature (°C.) | Film Depositing Rate ($\mu$m/min.) | Result of Raman Spectroscopy |
|---|---|---|---|
| 0.1 | 2800 | 0.1 | A sharp peak at 1333 cm$^{-1}$ A low broad peak at around 1550 cm$^{-1}$ |
| | 3000 | 1.1 | A sharp peak only at 1333 cm$^{-1}$ |
| | 3300 | 1.8 | A sharp peak only at 1333 cm$^{-1}$ |
| 0.5 | 2800 | 0.2 | A sharp peak at 1333 cm$^{-1}$ A low broad peak at around 1550 cm$^{-1}$ |
| | 3000 | 2.1 | A sharp peak only at 1333 cm$^{-1}$ |
| | 3300 | 3.1 | A sharp peak only at 1333 cm$^{-1}$ |
| 2.0 | 2800 | 0.2 | A sharp peak at 1333 cm$^{-1}$ A low broad peak at around 1550 cm$^{-1}$ |
| | 3000 | 2.8 | A sharp peak at 1333 cm$^{-1}$ A low broad peak at around 1550 cm$^{-1}$ |
| | 3300 | 3.4 | A sharp peak only at 1333 cm$^{-1}$ |

It is apparent from the results of the analyses that the following were confirmed: Diamond could be deposited on the substrate over a wider area and at a higher depositing rate according to the process and the apparatus for synthesizing diamond. Here, the obtained diamond films were substantially free from the non-diamond phase and had good qualities, since the generating temperature of the activated gas could be increased to a higher temperature. This is believed that the atomic hydrogens which remove the non-diamond phase by etching has been generated in a greater amount.

SECOND PREFERRED EMBODIMENT

In the first preferred embodiment, the electrodes formed in a flat plate shape as illustrated in FIG. 2 were employed for the electrodes 13 and 13, and the gravel-shaped tantalum carbide constituting the porous heating element 14 was packed between the electrodes 13 and 13 which were spaced at an interval in a manner being opposite to each other.

Figure 3:
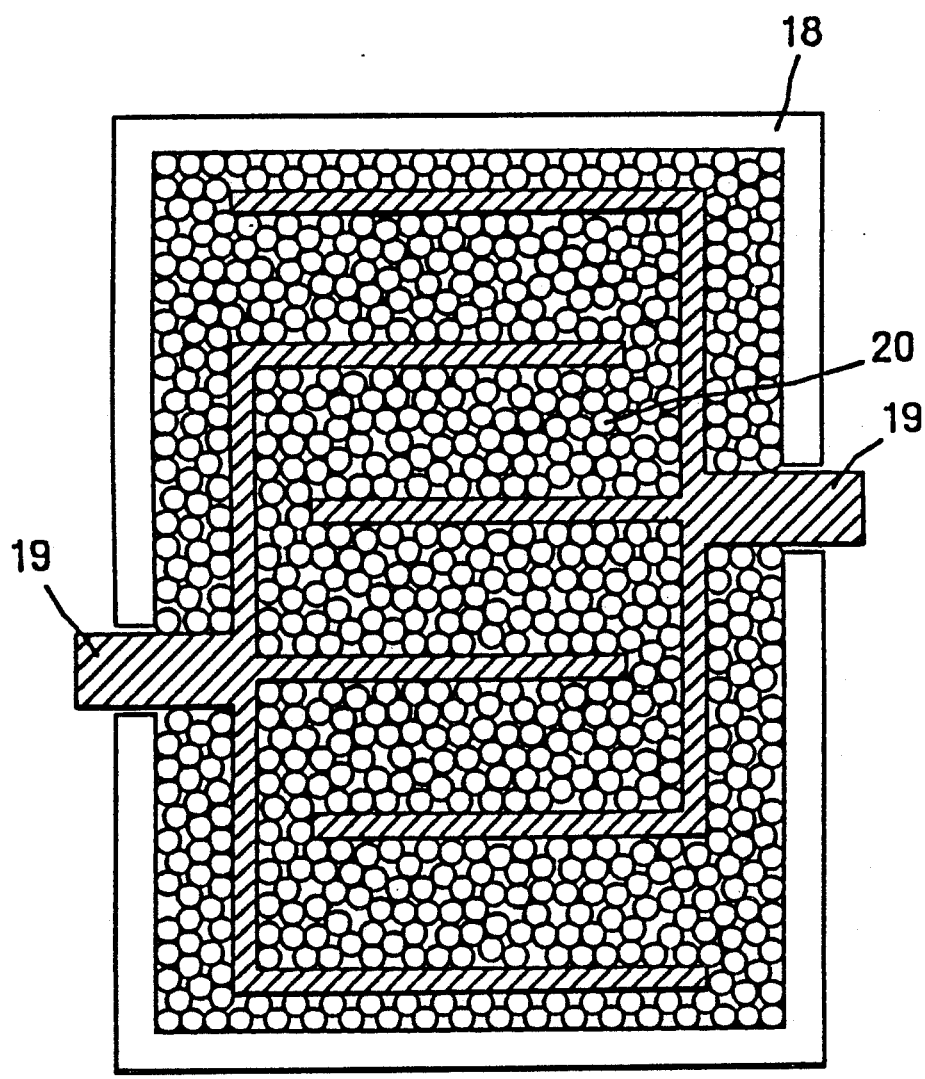
FIG. 3 is a horizontal cross sectional view of a major portion of a heating chamber of a similar apparatus for synthesizing diamond described as a second preferred embodiment, and is taken in the direction identical to FIG. 2.

Instead of the electrodes 13 and 13, a pair of electrodes 19 and 19 formed in a comb shape as illustrated in FIG. 3 may be employed in the second preferred embodiment. The electrodes 19 and 19 are disposed in a square cylinder 18 so that the teeth of one of the comb-shaped electrodes 19 and 19 are placed between the teeth of the other comb-shaped electrode 19, and gravel-shaped tantalum carbide is packed between the comb-shaped electrodes 19 and 19 to make a porous heating element 20. Thus, the size of the porous heating element 20 can be made greater. By employing the porous heating element 20, a high quality diamond can be deposited on the surface of the substrate over a much wider area thereof in a film shape.

Evaluation on the Effect of Porous Exothermic Body

Experiments are carried out in order to evaluate how the configuration of the porous heating element influences on the uniform heat generation and the uniform flow rate. The examples of the experiments will be hereinafter described.

Influence on the Uniform Heat Generation

In order to uniformly deposit a diamond film on a substrate in a wider area by using the porous heating element of the above-mentioned type, it is most important to have the porous heating element generate heat uniformly. The following try-outs were carried out to fulfill the assignment when preparing a porous heating element under the same conditions described in the first preferred embodiment.

First Try-out

After carbonizing and pulverizing the metal tantalum, the pulverized gravel-shaped tantalum carbide particles having the average particle size of 2.0 to 2.5 mm were sieved. Then, the pulverized gravel-shaped tantalum carbide particles were put into a ball mill approximately up to 60% by volume of the ball mill, ethanol was added by an amount substantially soaking the whole of the pulverized gravel-shaped tantalum carbide particles, and thereafter the ball mill was rotated for 300 hours. During the rotation, the gravel-shaped tantalum carbide particles wore each other, lost their corners and edges, and turned into shapes relatively resembling a sphere. Further, the tantalum carbide particles having the average particle size of 1.5 to 2.0 mm were again sieved, washed with benzene, and dried to make a porous heating element. The temperature distribution of the porous heating element of the first preferred embodiment fluctuated in the range of approximately ±60° C. when it is heated at the temperature of 2800° C. and measured at various portions with a pyrometer capable of measuring the range of 10 mm in diameter. On the other hand, the porous heating element made of the sphere-shaped tantalum carbide particles of the first try-out exhibited a temperature distribution fluctuating remarkably less in the range of ±18° C. under the same conditions.

Second Try-out

In the same manner as the above-mentioned first try-out, tantalum carbide particles having the average particle size of 2.5 to 3.0 mm were prepared to make the other porous heating element. As a result, the other porous heating element exhibited a temperature distribution fluctuating in the range of ±44° C., which was not so good as the first try-out, at the various measured portions under the same conditions. It is believed that this might have resulted from the number of the contact points fluctuated statistically.

Hence, ideally speaking, it is important for the uniform temperature, i.e., the uniform heat generation, that the tantalum carbide particles have a sphere shape and that the average particle size thereof is reduced to a predetermined level.

Influence on the Uniform Flow Rate

The uniformity in the gas flow flowing in the porous heating element is an important factor as well as the uniformity in the temperature distribution. When the particles of the porous heating element to be packed are rather coarse, the packing also fluctuates statistically. If such is the case, there arises a temperature fluctuation in the gas flowing in the porous heating element. As a result, it is hard to obtain diamond of a uniform film. On the contrary, when the particles thereof having the average particle size of 1.0 mm or less are packed, the back pressure increases and accordingly there arises a troubled gas flow depending on the gas flow rate, namely the gas flow rate is more than a predetermined value.

The tantalum carbide particles having the above-mentioned sphere-like shape were sieved to obtain tantalum carbide particles having the average particle size of 1.5 to 2.0 mm. The thus sieved tantalum carbide particles were employed for preparing a porous heating element. An experimental diamond deposition was carried out in a manner similar to the process of the first preferred embodiment and with the diamond synthesizing apparatus of the first preferred embodiment employing the thus formed porous heating element. The conditions of the experimental diamond deposition were as follows: The flow rate of the methane as the reactant gas was set at 0.5% by volume, and the porous heating element was heated at 3000° C.

When compared with the first preferred embodiment, there was no difference in the depositing rate and the like. However, the blackish unevenness in color was reduced to an extremely lesser degree in the appearance of the diamond film deposited by this experimental diamond deposition. This is believed that the partial deposition of the non-diamond phase as well as the dispersion of the diamond crystallinity had been reduced.

The porous heating element employed in the above-mentioned first preferred embodiment is formed by only packing particles having a gravel shape or a sphere shape. Accordingly, it is necessary to devise a means for maintaining the packed layer. For instance, the following means may be employed therefor:

Only the metal tantalum of sphere-like particles may be filled in advance, subjected to an application of electricity in vacuum or in an inert gas to generate heat at the contact portions among the metal tantalum particles thereby sintering at the contact portions only, and thereafter the porous substance is carbonized; or Tantalum carbide particles are packed in a container, a reactant system capable of depositing tantalum carbide therein is then selected, and finally the contact portions among the tantalum carbide particles are joined by a CVD method.

When the thus integrated porous heating element is obtained, the diamond synthesizing apparatus of the present invention will be of an extremely simple structure.

Therefore, the porous heating element may basically comprise any substance as far as it has electric conductivity, heat resistance, and permeability as well.

Having now fully described the invention, it will be apparent to one of ordinary skill in the art that many changes and modifications can be made thereto without departing from the spirit or scope of the invention as set forth herein.

What is claimed is:

1. An apparatus for synthesizing diamond comprising:
    a heating means comprising a porous heating element having a melting point or a decomposition temperature equal to or greater than 2000° C. and comprising at least one selected from the group consisting of metals and electrically conductive ceramics, at least a pair of electrodes for applying electricity to said porous heating element, an inlet port for introducing a reactant gas comprising at least a carbonaceous source gas into said porous heating element and an outlet port for delivering out an activated gas generated by heating said reactant gas with said porous heating element;
    a substrate on which diamond is to be deposited disposed on the outlet port side of said heating means; and
    a means for holding the substrate and for controlling a temperature of the substrate.

2. The apparatus for synthesizing diamond according to claim 1, wherein said apparatus is enclosed in a pressurized container or a depressurized container.

3. The apparatus for synthesizing diamond according to claim 1 further comprising at least one metal net for straightening the flow of said reactant gas disposed between said porous heating element and said substrate.

4. The apparatus for synthesizing diamond according to claim 1 further comprising a temperature detecting means for assuring said porous heating element disposed on said outlet port side of said heating means and a temperature controlling means for controlling the electricity to be applied to said porous heating element in accordance with the temperature measured by said temperature detecting means.

5. The apparatus for synthesizing diamond according to claim 1, wherein said electrodes are formed in a comb shape and disposed in said heating means so that the teeth of one of the comb-shaped electrodes are placed between the teeth of the other comb-shaped electrode.

6. The apparatus for synthesizing diamond according to claim 1, wherein said porous heating element is formed of a foamed porous body whose pores are formed continuously or a porous body whose pores are continuously formed among packed particles.

7. The apparatus for synthesizing diamond according to claim 6, wherein said packed particles have an average particle size falling range of 1 to 5 mm.

8. The apparatus for synthesizing diamond according to claim 1, wherein said metals comprise at least one metal selected from the group consisting of tungsten and tantalum.

9. The apparatus for synthesizing diamond according to claim 1, wherein said electrically conductive ceramics comprise at least one ceramic selected from the group consisting of tungsten carbide, tantalum carbide and zirconium boride.

10. The apparatus for synthesizing diamond according to claim 1, wherein said substrate is at least one ceramic selected from the group consisting of sintered tungsten carbide, silicon, silicon carbide, alumina, tungsten and molybdenum.

11. The apparatus for synthesizing diamond according to claim 1, wherein a surface of said substrate is abraded and roughened.

* * * * *

UNITED STATES PATENT AND TRADEMARK OFFICE
CERTIFICATE OF CORRECTION

PATENT NO. : 5,068,871
DATED : November 26, 1991
INVENTOR(S) : Kiyoshi Uchida, Shoji Noda and Kazuo Higuchi It is certified that error appears in the above-indentified patent and that said Letters Patent is hereby corrected as shown below:

On the title page: Item [57] line 2, delete "is brought."

Signed and Sealed this

Twenty-eighth Day of December, 1993

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,068,871

DATED : November 26, 1991

INVENTOR(S) : Kiyoshi Uchida, Shoji Noda and Kazuo Higuchi

It is certified that error appears in the above-identified patent and that said Letters Patent is hereby corrected as shown below:

Col. 12, claim 4, line 7, change "assuring" to
--measuring--.

Signed and Sealed this

Twelfth Day of April, 1994

*Attest:*

*Attesting Officer*

BRUCE LEHMAN

*Commissioner of Patents and Trademarks*